United States Patent
Ikram et al.

(10) Patent No.: US 10,002,216 B2
(45) Date of Patent: Jun. 19, 2018

(54) SYSTEMS AND METHODS FOR DYNAMIC REGRESSION TEST GENERATION USING COVERAGE-BASED CLUSTERING

(71) Applicant: CAVIUM, INC., San Jose, CA (US)

(72) Inventors: Shahid Ikram, Shrewsbury, MA (US); James Ellis, Hubbardston, MA (US)

(73) Assignee: Cavium, Inc., San Jose, CA (US)

( * ) Notice: Subject to any disclaimer, the term of this patent is extended or adjusted under 35 U.S.C. 154(b) by 35 days.

(21) Appl. No.: 15/291,475

(22) Filed: Oct. 12, 2016

(65) Prior Publication Data

US 2017/0161402 A1   Jun. 8, 2017

Related U.S. Application Data

(60) Provisional application No. 62/262,184, filed on Dec. 2, 2015.

(51) Int. Cl.
*G06F 17/00* (2006.01)
*G06F 17/50* (2006.01)

(52) U.S. Cl.
CPC ................ *G06F 17/504* (2013.01)

(58) Field of Classification Search
USPC ........................................ 716/106
See application file for complete search history.

(56) References Cited

U.S. PATENT DOCUMENTS

| | | | | |
|---|---|---|---|---|
| 2004/0019859 | A1* | 1/2004 | Ravi | G06F 17/5022 716/103 |
| 2005/0102596 | A1* | 5/2005 | Hekmatpour | G01R 31/31835 714/741 |
| 2009/0288059 | A1* | 11/2009 | Dimou | G06F 9/3869 716/104 |
| 2013/0019216 | A1* | 1/2013 | Vasudevan | G06F 17/504 716/106 |
| 2015/0040096 | A1* | 2/2015 | Chang | G06F 17/5027 716/136 |
| 2017/0161402 | A1* | 6/2017 | Ikram | G06F 17/504 |

OTHER PUBLICATIONS

Ahmed Yehia, "UCIS Applications: Improving Verification Productivity, Simulation Throughput, and Cover Closure Process" DVCON 2-14, San Jose, CA, 2014.

(Continued)

*Primary Examiner* — Mohammed Alam (57) ABSTRACT

A new approach is proposed that contemplates systems and methods to support dynamic regression test generation for an IC design based upon coverage-based clustering of RTL modules in the design. First, coverage data for code coverage by a plurality of RTL modules in the IC design are collected and a plurality of clusters of related RTL modules of the IC design are generated based on statistical analysis of the collected coverage data and hierarchal information of the RTL modules. When changes are made to the RTL modules during the IC design process, a plurality of affected RTL modules are identified based on the clusters of the RTL modules and a plurality of regression tests are generated dynamically for these affected RTL modules based on their corresponding coverage data. The dynamically generated regression tests are then run to verify the changes made in the IC design.

31 Claims, 6 Drawing Sheets

(56) References Cited

OTHER PUBLICATIONS

Synopsys, Inc., "Coverage Technology User Guide," Synopsys, Inc., Mountain View, CA, 2012.
Monica Farkash, et al., "Mining Coverage Data for Test Set Coverage Efficiency", DVCON 2015, Santa Clara, CA, 2015.
Monica Farkash, et al. "Regression Optimization using Hierarchical Jaccard Similarity and Machine Learning", DAC 2013, Austin, TX, 2013.
C. Spear and G. Tumbush, "System Verilog for Verification", Third Edition. Springer, ISBN 978-1-4614-0714-0, 608 pages, 2012.
James Gareth, et al., "An Introduction to Statistical Learning", Fourth Edition. Springer, ISBN 978-1-4614-7168-7, 140 pages, 2014.
Robert Sedgewick and Kevin Wayne, "Algorithms" Fourth Edition. Springer, ISBN 978-0-325-7351-3, 992 pages, 2011.
Odilia Yim and Kylee T. Ramdeen, "Hierarchical Cluster Analysis: Comparison of Three Linkage Measures and Application to Psychological Data", The Quantitative Methods for Psychology, vol. 11, No. 1, 2015.
H. Finch, "Comparison of Distance Measures in Cluster Analysis with Dichotomous Data", Journal of Data Science, 3(1), pp. 85-100, 2005.
S. Biswas, et al., "Regression Test Selection Techniques: A Survey", Informatica 35, pp. 289-321, 2011.
M.J. Arafeen and Hyunsook Do, "Test Case Prioritization Using Requirements-Based Clustering", IEEE Sixth International Conference on Software Testing, Verification and Validation (ICST), pp. 312-321, 2013.
Synopsys, Inc., "Certitude User Manual," Synopsys, Inc., Mountain View, CA, 2013.
John Mandel, "The Statistical Analysis of Experimental Data", Wiley and Sons, 1964.
Ashima Singh, "Prioritizing Test Cases in Regression Testing using Fault Based Analysis", International Journal of Computer Science Issues, vol. 9, Issue 6, No. 1, Nov. 2012.
J.W. Foreman, "Data Smart" Wiley, ISBN: 978-1-118-66146-8, 2013.
Norman Matloff, "The Art of R Programming", No Starch Press, ISBN: 978-1-59327-410-8, 2011.

* cited by examiner

Collect coverage data for code coverage by a plurality of RTL modules in an IC design for testing of the IC design through simulations, wherein the coverage data provides a measure of how well functionalities of the IC design are covered
602

Generate a plurality of clusters of related RTL modules of the IC design based on statistical analysis of the collected coverage data and hierarchal information of the RTL modules
604

Identify a plurality of affected RTL modules based on the clusters of the RTL modules when changes are made to the RTL modules in the IC design
606

Generate a plurality of regression tests dynamically for these affected RTL modules based on their corresponding coverage data
608

Run the dynamically generated regression tests to verify the changes made in the IC design
610

FIG. 6

SYSTEMS AND METHODS FOR DYNAMIC REGRESSION TEST GENERATION USING COVERAGE-BASED CLUSTERING

CROSS-REFERENCE TO RELATED APPLICATIONS

This application claims the benefit of U.S. Provisional Patent Application No. 62/262,184, filed Dec. 2, 2015, and entitled "Dynamic Regression Suite Generation Using Coverage-Based Clustering," and is hereby incorporated herein in its entirety by reference.

BACKGROUND

Simulation of an integrated circuit (IC) design such as System-on-Chip (SOC) or an application-specific integrated circuit (ASIC) requires a verification environment for a plurality of register-transfer level (RTL) modules in the design. At an abstract level, the verification environment can be viewed as a composition of a plurality of tests, which run during the simulation in addition to monitoring and detection mechanisms. The RTL modules and the verification environment are living entities during the life of the IC design project and evolve with the project. Each of the plurality of RTL modules may have multiple instances and is holistic in the sense that the sum of its instances is greater than its parts, implying mutual dependencies of the RTL instances to achieve the goals of the overall IC design implementation.

Whenever a portion of the IC design changes at the RTL level, the IC designer needs to ensure that first, the new functionality is working and secondly, it has not broken any other pieces in the design. The first part can be tested using resolution tests and second part is tested through regressions. Both sets of tests are a subset of tests created by the experts of the IC design. Regressions typically incur the largest costs in the IC design projects in terms of time, simulation, compute and human resources. As such, it is important to determine that, when RTL modules have been changed, which subset of available tests should be run for regression in order to ascertain the two objectives above while taking minimal resources in terms of time, computes, licenses etc.

Although a static analysis of the RTL modules can yield the dependencies among the RTL modules, regression tests for verification are dynamic with constraints and random seeds. Therefore, a regression test generation approach that can analyze the dynamics of the IC design in order to provide better insight is desired.

The foregoing examples of the related art and limitations related therewith are intended to be illustrative and not exclusive. Other limitations of the related art will become apparent upon a reading of the specification and a study of the drawings.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION OF EMBODIMENTS

The following disclosure provides many different embodiments, or examples, for implementing different features of the subject matter. Specific examples of components and arrangements are described below to simplify the present disclosure. These are, of course, merely examples and are not intended to be limiting. In addition, the present disclosure may repeat reference numerals and/or letters in the various examples. This repetition is for the purpose of simplicity and clarity and does not in itself dictate a relationship between the various embodiments and/or configurations discussed.

A new approach is proposed that contemplates systems and methods to support dynamic regression test generation for an IC design based upon coverage-based clustering of RTL modules in the design. First, coverage data for code coverage by a plurality of RTL modules in the IC design are collected and a plurality of clusters of related RTL modules of the IC design are generated based on statistical analysis of the collected coverage data and hierarchal information of the RTL modules. When changes are made to the RTL modules during the IC design process, a plurality of affected RTL modules are identified based on the clusters of the RTL modules and a plurality of regression tests are generated dynamically for these affected RTL modules based on their corresponding coverage data. The dynamically generated regression tests are then run to verify the changes made in the IC design.

The proposed approach generates a list of retestable regression tests dynamically using hierarchal coverage information of the RTL modules without relying upon any user requirements documentation. Since fewer targeted regression tests are needed to achieve a similar level of confidence in the verification of the IC design compared to conventional regression methods, such an approach provides savings of the resources in terms of simulation licenses as well as time to run the regression tests. Moreover, a bigger saving is in terms of human resources can be achieved as fewer regression tests need to be debugged. In addition, by creating the retestable tests dynamically, the proposed approach takes away the guess work to create the regression test suites and provides a user (IC designer) quantitative measures to assist the designer to make informed decisions.

As referred to hereinafter, a (regression) test is a process that simulates an IC design. It uses stimuli to drive the IC design, constraints to restrain the inputs to the legal values, monitors to watch the progress, and checkers to validate the outputs from the design. The test can be directed to check a specific scenario or a constrained random and/or a variety of cases.

As referred to hereinafter, coverage is a measure of quality of a test. In a verification environment, three classes of tests should be run after the changes have been committed—obsolete, redundant and retestable. A test is considered to be obsolete if it is no longer relevant to the verification of the IC design, e.g., it is generating coverage below a certain threshold. A test is considered to be redundant if it is covering a functionality unrelated to the changes made in the IC design. Tests that cover affected areas/changes of the IC design are retestable and should be run for regression after the changes are made.

As referred to hereinafter, regression is defined as running a group of tests after the IC design goes through some changes. The retestable subset of the available test is a starting point for the regression. A number of strategies can be employed to define different regression suites depending upon the design-verification methodology. For example, a soft regression list may include a small number of tests constrained by a time limit while a nightly regression list may not be constrained by time and can cover a larger design state space.

Figure 1:
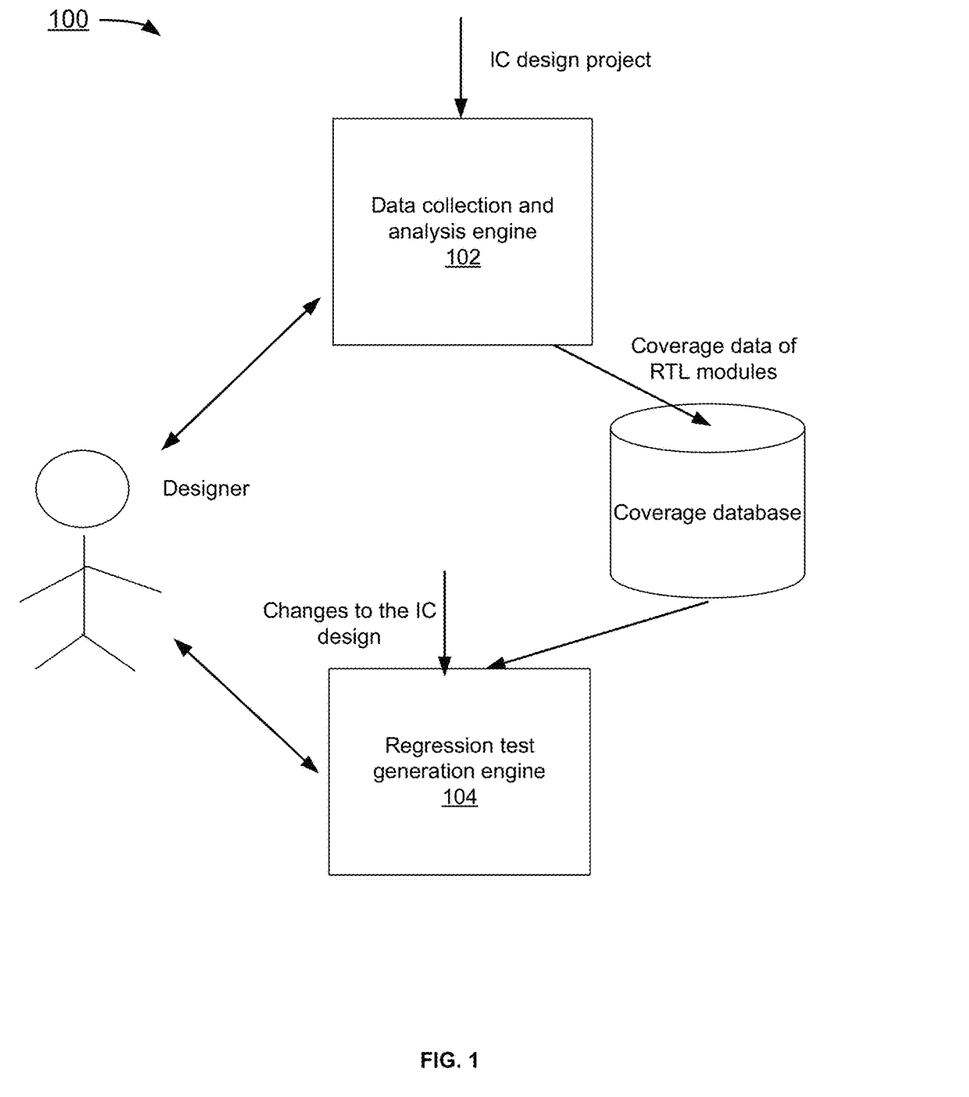
FIG. 1 shows an example of a system diagram to support dynamic regression test suite generation using coverage-based clustering in accordance with some embodiments.

FIG. 1 shows an example of a system diagram to support dynamic regression test suite generation using coverage-based clustering. Although the diagrams depict components as functionally separate, such depiction is merely for illustrative purposes. It will be apparent that the components portrayed in this figure can be arbitrarily combined or divided into separate software, firmware and/or hardware components. Furthermore, it will also be apparent that such components, regardless of how they are combined or divided, can execute on the same host or multiple hosts, and wherein the multiple hosts can be connected by one or more networks.

In the example of FIG. 1, the system 100 includes at least a data collection and analysis engine 102 and a regression test generation engine 104. As used herein, the term engine refers to software, firmware, hardware, or other component that is used to effectuate a purpose. The engine will typically include a computing unit/appliance/host and software instructions that are stored in a storage unit such as a non-volatile memory (also referred to as secondary memory) of the computing unit for practicing one or more processes. When the software instructions are executed, at least a subset of the software instructions is loaded into memory (also referred to as primary memory) by the computing unit, the computing unit becomes a special purpose for practicing the processes. The processes may also be at least partially embodied in the computing unit into which computer program code is loaded and/or executed, such that, the computing unit becomes a special purpose computing unit for practicing the processes. When implemented on a general-purpose computing unit, the computer program code segments configure the computing unit to create specific logic circuits. The processes may alternatively be at least partially embodied in a digital signal processor formed of application specific integrated circuits for performing the processes.

In the example of FIG. 1, each of the engines can run on one or more hosting devices (hosts). Here, a host can be a computing device, a communication device, a storage device, or any electronic device capable of running a software component. For non-limiting examples, a computing device can be but is not limited to a laptop PC, a desktop PC, a tablet PC, or a server machine. A storage device can be but is not limited to a hard disk drive, a flash memory drive, or any portable storage device. A communication device can be but is not limited to a mobile phone.

Figure 2:
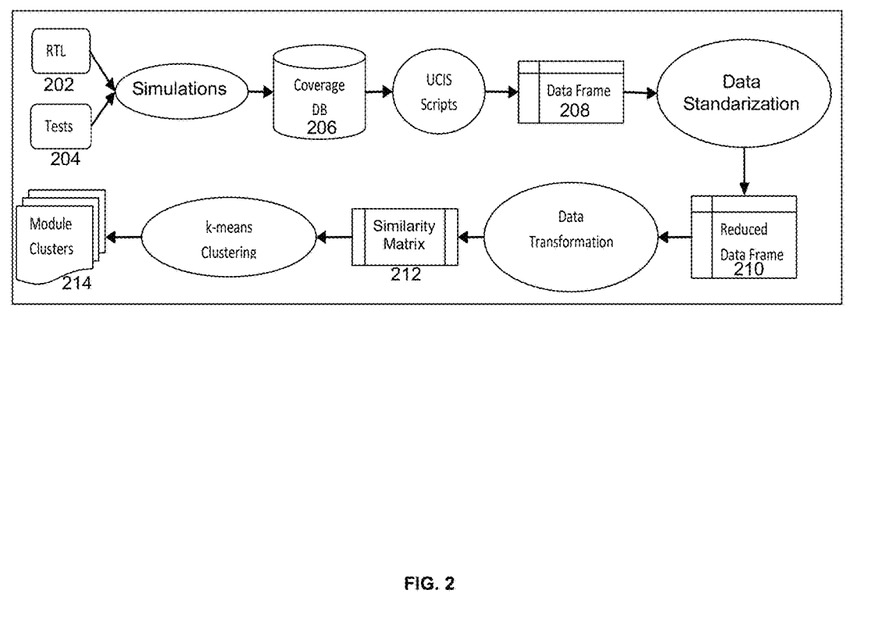
FIG. 2 depicts an example of an overview of the data collection and analysis process performed by the data collection and analysis engine in FIG. 1 in accordance with some embodiments.

FIG. 2 depicts an example of an overview of the data collection and analysis process performed by the data collection and analysis engine 102. As shown by the example of FIG. 2, the data collection and analysis engine 102 is configured to collect coverage data of code coverage by a plurality of RTL modules 202 in the IC design for running available tests 204 of the IC design through simulations. Here, the coverage data provides a measure of how well functionalities of the IC design are covered. The metrics of the coverage data collected for code coverage include but are not limited to, line coverage, condition coverage, branch coverage, path coverage, toggle coverage and functional coverage. With the exception of the functional (assertion) coverage, which is manually generated, nearly all of the coverage metrics are auto-generated and any one of them can be chosen as similarity criteria to measure how and when different RTL modules show similar coverage behaviors. In some embodiments, the data collection and analysis engine 102 is configured to choose a metric of the coverage data having the maximum amount of information of the IC design, e.g., one that shows maximum variance, which is design dependent, as discussed in details below.

In some embodiments, the coverage data is collected and stored by the data collection and analysis engine 102 in a coverage database 206 on per RTL module and per test basis. In some embodiments, the data collection and analysis engine 102 is configured to utilize a standardized interface to the coverage database 206, such as Unified Coverage Interoperability Standard UCIS, to extract the coverage data from the coverage database 206. In some embodiments, the collected data can be extracted as data-frame 208, which is a table with labeled columns, in a comma-separated format. Each row of this table provides per RTL module per test coverage information. Each row also contains the test's run time, depth of the RTL module in the design hierarchy of the IC design (RTL hierarchical information) and the RTL filename. The table below shows examples of a few sample lines with selected columns of the table for one of RTL modules.

| Module   | Test    | Time | Line | Toggle | Branch |
|----------|---------|------|------|--------|--------|
| Bisr_ctl | Bar0_d  | 987  | 28   | 14     | 28     |
| Bisr_dp  | Bar0_d  | 987  | 13   | 914    | 4      |
| Arb_rot  | Bar0_d  | 987  | 5    | 3      | 2      |

Since the coverage data for different types of the code-coverage may vary by different margins, in some embodiments, the data collection and analysis engine 102 is configured to standardize these data for the different types of the code-coverage to make them comparable and to generate a global score. In some embodiments, the global score is a product of the coverage-value of each of the RTL modules with its depth in the IC design hierarchy and can be included as an additional column in the table. In some embodiments, the data standardization process can be performed by subtracting the average of each column in the table from each of its entries and dividing the entries with its standard-deviation. Here, negative signs can be ignored since the designer is only interested in coverage values.

In some embodiments, the data collection and analysis engine 102 is configured to reduce the coverage data in the form of data frames to a useful subset of reduced data frame 210 of coverage data without losing pertinent information for data analysis. For this purpose, the data collection and analysis engine 102 is configured to adopt two different methods—the first one uses statistical information present in the coverage data to reduce the number of columns in the table and the second one uses knowledge of the design practices to reduce number of rows in the table.

In some embodiments, the data collection and analysis engine 102 is configured to examine columns of the coverage data in the form of data-frame to determine and select the column contains the most useful information with respect to the clustering of the RTL modules. In some embodiments, the data collection and analysis engine 102 is configured to examine the variance of each of the columns of the coverage data-frame including the global score and choose the one with the most variance. Although the global score may be the best discriminator in most case, there are cases where toggle coverage or line coverage provides better results.

In a large scale IC (e.g., VLSI) design, there are two distinct categories of the RTL modules:

Common modules, which are modules performing well known functionality and are used repeatedly across different parts of the IC design (and across different IC design projects). Well-known common modules include but are not limited to FIFOs, arbiters, and counters.

Application specific modules, which are modules created to implement specific features of the IC design and define blocks of the design that are verified individually before becoming part of the full-chip verification. For non-limiting examples, application specific modules include but are not limited to input-packet processer, crypto-unit, compression-unit etc.

Since all of the common modules reside in a common area of IC, the list of these modules can be auto-generated and used to remove the related rows from the coverage data-frame.

In some embodiments, the data collection and analysis engine 102 is configured to determine which of the RTL modules in the IC design are correlated by identifying subgroups in the collected coverage data through unsupervised learning based upon similarity or dissimilarity between each pair of the RTL modules in terms of their coverage data. The modules most similar to each other are grouped or clustered together. The learning or clustering is called unsupervised because the data collection and analysis engine 102 tries to find out structures in the coverage data without any response variable.

Figure 3:
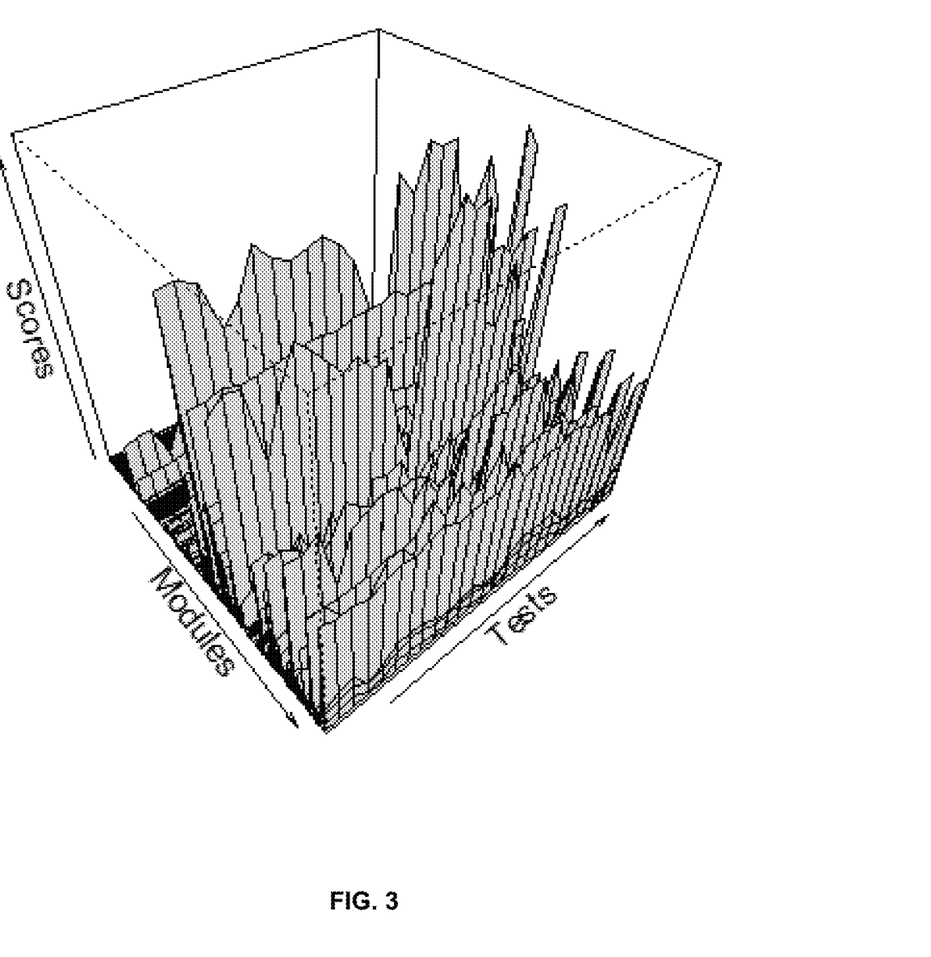
FIG. 3 depicts an example of a three dimensional perspective of a similarity matrix of an IC design in accordance with some embodiments.

In some embodiments, the data collection and analysis engine 102 is configured to utilize a similarity matrix 212 among the RTL modules for similarity analysis, wherein the similarity matrix is a table generated from the reduced coverage data-frame 210 with rows labeled with module names and column labeled with test names. The similarity matrix 212 provides a way to compare behavior of different RTL modules for the available tests. If for any two modules associated row vectors are behaving similarly, these modules are related. Otherwise they are not. FIG. 3 depicts an example of a three dimensional perspective of a similarity matrix of an IC design including 28 tests and 500+ modules, wherein the z-axis represents the accumulative coverage scores of the design.

Figure 4:
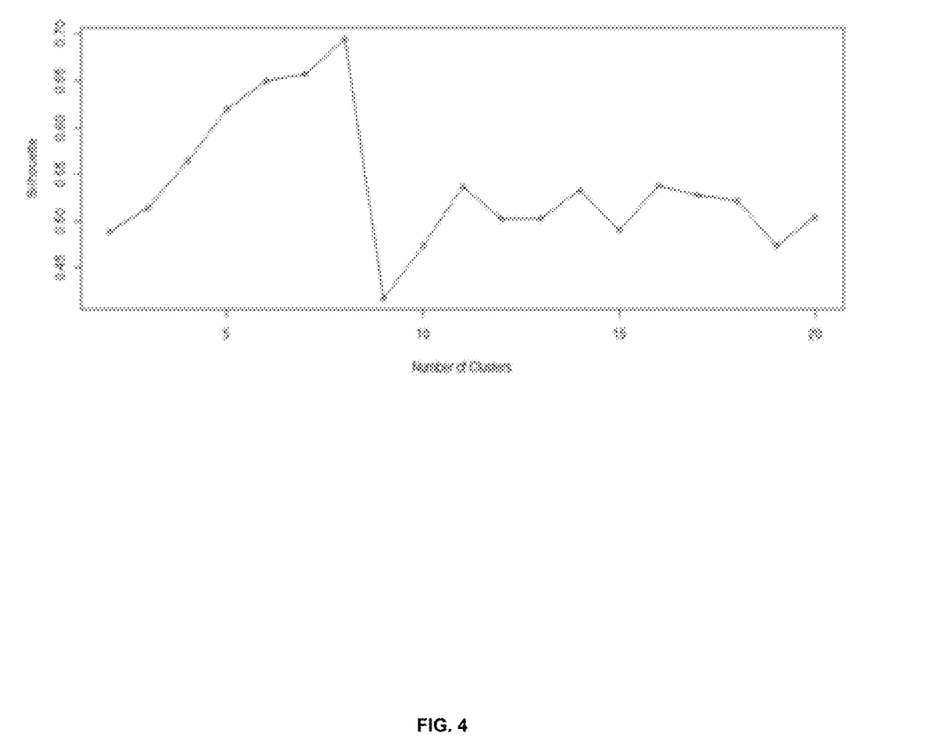
FIG. 4 depicts an example of silhouette calculations for an IC design in accordance with some embodiments.

In some embodiments, the data collection and analysis engine 102 is configured to group the correlated RTL modules into a plurality of module clusters 214 based upon the similarity matrix generated. The RTL modules with relatively smaller distances (larger similarity) from each other are clustered together into each of the module clusters 214. In some embodiments, k-means clustering is used to create the plurality of module clusters 214, where an initial guess for the k (the number of clusters) is made, which can be automatically adjusted (increased or decreased) to fit the clusters to the IC design. To automate this process, the concept of "silhouette" from statistical learning is used, wherein the silhouette can be calculated as:

(Average distance to those in the nearest neighboring cluster−Average distance to those in the current cluster)/The maximum of those two averages An ideal clustering of the RTL modules results in a silhouette of 1(or −1) and a bad cluster may result in a silhouette of 0. FIG. 4 depicts an example of silhouette calculations for an IC design, which shows that the best number of clusters for this case is 8.

In some embodiments, the data collection and analysis engine 102 is configured to perform repeated clustering of the RTL modules, where a first clustering process yields the best silhouette results for only a relatively small number of clusters, indicating a clear division in the IC design that in turn hides smaller clusters in each of its sub-divisions. For such a case, the data collection and analysis engine 102 is configured to use this first level of clustering to divide the IC design into two or more distinct groups of RTL modules and then for each of those groups, run separate clustering processes.

In some embodiments, the data collection and analysis engine 102 is configured to validate the clusters of RTL modules created as the grouping of the RTL modules may not always be meaningful. One of the cluster validation techniques is a design review to see if the clustering is true to the designer's understanding of the IC design. In some embodiments, information of the clusters generated becomes a part of the coverage data-frame 208 as an additional column in the table, categorizing each module in terms of a cluster number it belongs to. It effectively divides the coverage data-frame 208 into a plurality of smaller data-frames, one for each cluster. In some embodiments, the data collection and analysis engine 102 is configured to provide the clusters 214 of the RTL modules to the IC designer or analyst to determine if such clustering is consistent with intentions of the designer through base-line comparisons and experimentation.

Figure 5:
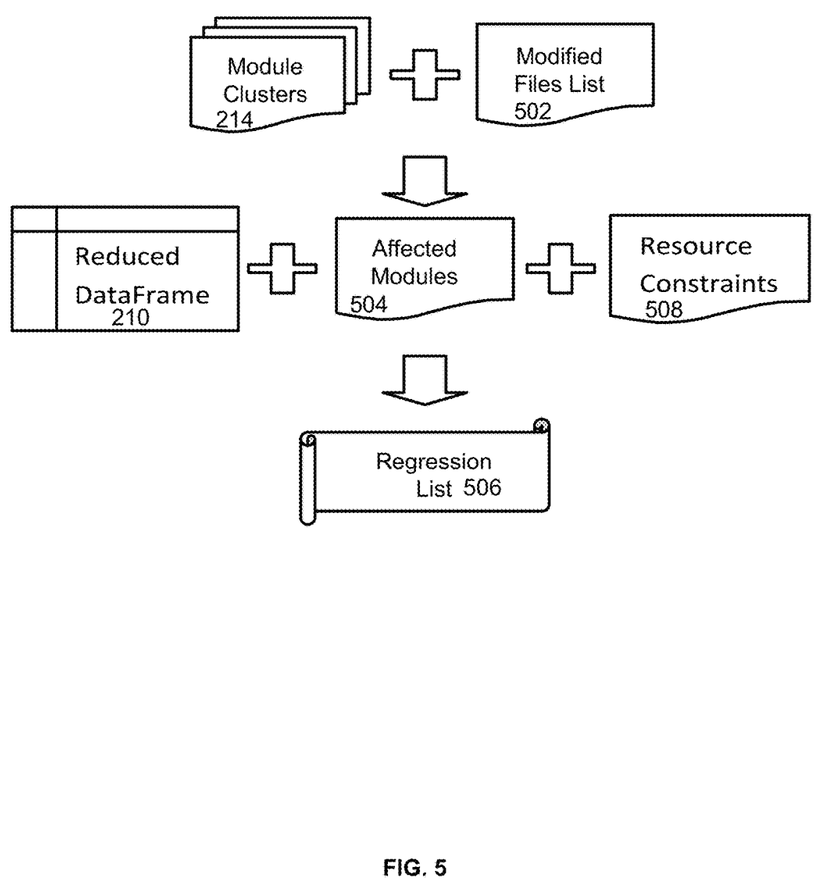
FIG. 5 depicts an example of an overview of a two-step regression list generation process performed by the regression test generation engine in FIG. 1 in accordance with some embodiments.

FIG. 5 depicts an example of an overview of a two-step regression list generation process performed by the regression test generation engine 104 to create a suitable regression list of available tests to cover the influence changes made to the RTL modules. The first step in the process is to find the related RTL modules affected by the changes and second step is to choose the best tests for these RTL modules as discussed in details below.

The coverage database 206 discussed above is configured to maintain files information, which include version control information for the regression test generation engine 104 to generate a list of files 502 modified since last check-out of the IC design. The regression test generation engine 104 is then configured to identify one or more modified RTL modules using the list of the modified files. Once the modified RTL modules have been identified, the regression test generation engine 104 is configured to perform a two-step process to identify the related affected modules in the same cluster as those modified RTL modules:

Include all of the modules instantiated in the list of modified modules as well as those instantiated in the same cluster 214 as the modified modules.

Use the information on module clusters 214 generated in coverage data analysis by the data collection and analysis engine 102 to find the rest of probably affected modules in the same cluster.

The outcome of this process is a list of modules 504 that must be validated to ensure that the changes in the IC design have not broken anything else.

In some embodiments, the regression test generation engine 104 is configured to utilize the list of the identified affected modules 504 to select a plurality of tests 506 for the regression based on their corresponding coverage data-frame 210 (in the reduced form). Here, the data-frame 210 contains information of the plurality of tests including but not limited to, run time, accumulative score and statistical variance metrics such as average, SD and CV (coefficient of variation). The table below shows examples of information of a list of tests as non-limiting examples.

| Tests | aScore | sd | time | CV |
|---|---|---|---|---|
| basic_msix | 2482 | 269 | 1005 | 75.99 |
| basic_swi_rsp_err | 2482 | 269 | 1476 | 75.99 |
| basic_prp_sml_qsize | 2479 | 268 | 1239 | 75.87 |
| perf_bw_basic_1_1028 | 2478 | 268 | 2039 | 75.88 |
| basic_multi | 2475 | 267 | 2323 | 75.75 |

In some embodiments, the regression test generation engine 104 is configured to grade and rank the plurality/list of regression tests 506 according to any of the metrics of their corresponding coverage data above depending upon specific requirements of regression. For non-limiting examples, the regression test generation engine 104 is configured to selects tests with high variance like high CV for a resolution test list and select tests with high aggregate scores (a Score in the table above) for regression list 506. In some embodiments, the designer can define a plurality of resource constraints 508 as regression test selection criteria to be utilized by the regression test generation engine 104 to select the list of regression tests. Here, the resource constraints 508 include but are not limited to a threshold on the number of tests to be selected for regression, and a threshold in terms of execution time of the tests to generate the final regression list 506. Finally, the regression test generation engine 104 is configured to run/execute the list of regression tests 506 to verify the changes made to the IC design.

Figure 6:
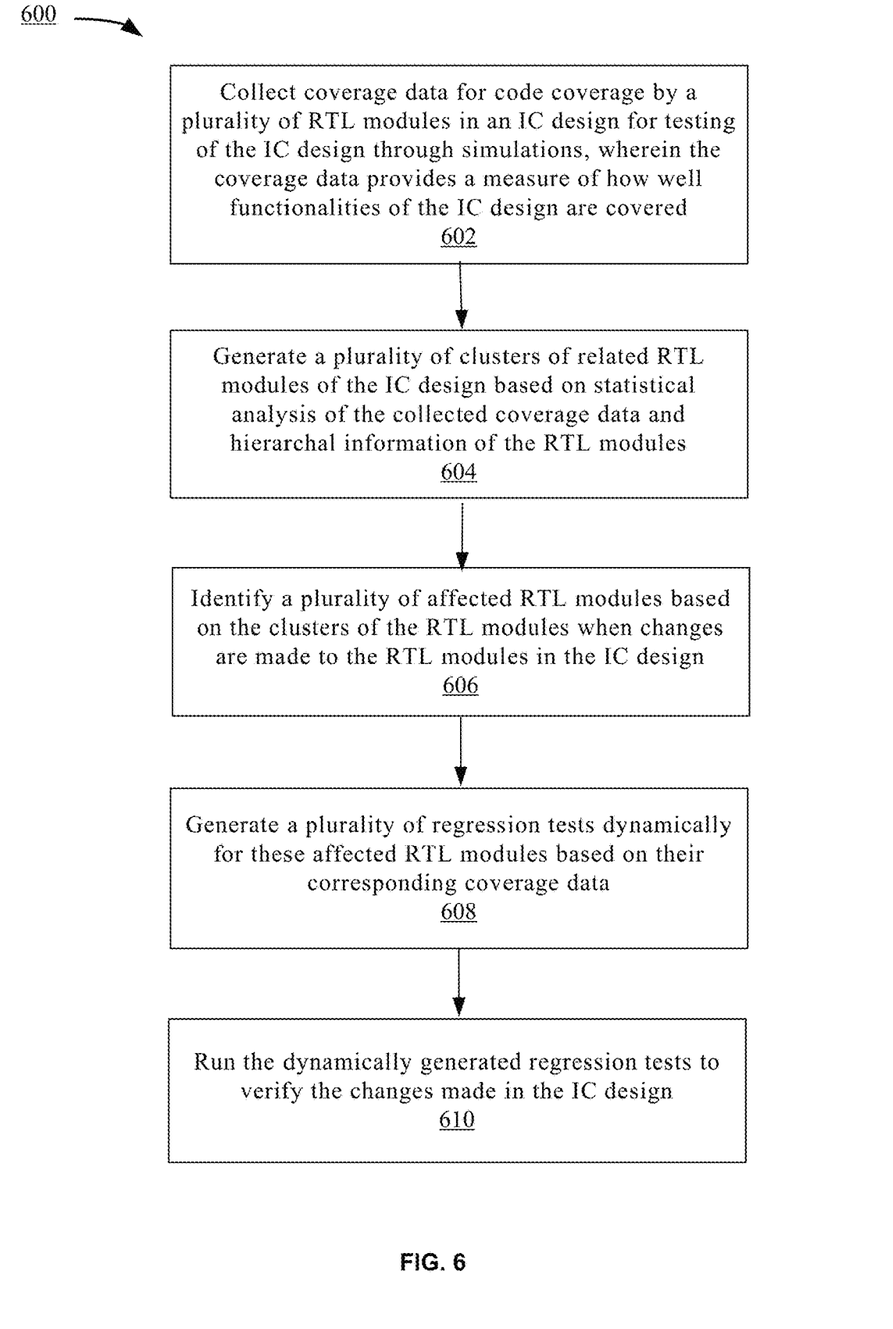
FIG. 6 depicts a flowchart of an example of a process to support dynamic regression test suite generation using coverage-based clustering in accordance with some embodiments.

FIG. 6 depicts a flowchart of an example of a process to support dynamic regression test suite generation using coverage-based clustering. Although this figure depicts functional steps in a particular order for purposes of illustration, the process is not limited to any particular order or arrangement of steps. One skilled in the relevant art will appreciate that the various steps portrayed in this figure could be omitted, rearranged, combined and/or adapted in various ways.

In the example of FIG. 6, the flowchart 600 starts at block 602, where coverage data for code coverage by a plurality of RTL modules in an IC design is collected for testing of the IC design through simulations, wherein the coverage data provides a measure of how well functionalities of the IC design are covered. The flowchart 600 continues to block 604, where a plurality of clusters of related RTL modules of the IC design are generated based on statistical analysis of the collected coverage data and hierarchal information of the RTL modules. The flowchart 600 continues to block 606, where a plurality of affected RTL modules are identified based on the clusters of the RTL modules when changes are made to the RTL modules in the IC design. The flowchart 600 continues to block 608, where a plurality of regression tests is generated dynamically for these affected RTL modules based on their corresponding coverage data. The flowchart 600 ends at block 610, where the dynamically generated regression tests are run to verify the changes made in the IC design.

One embodiment may be implemented using a conventional general purpose or a specialized digital computer or microprocessor(s) programmed according to the teachings of the present disclosure, as will be apparent to those skilled in the computer art. Appropriate software coding can readily be prepared by skilled programmers based on the teachings of the present disclosure, as will be apparent to those skilled in the software art. The invention may also be implemented by the preparation of integrated circuits or by interconnecting an appropriate network of conventional component circuits, as will be readily apparent to those skilled in the art.

One embodiment includes a computer program product which is a machine readable medium (media) having instructions stored thereon/in which can be used to program one or more hosts to perform any of the features presented herein. The machine readable medium can include, but is not limited to, one or more types of disks including floppy disks, optical discs, DVD, CD-ROMs, micro drive, and magneto-optical disks, ROMs, RAMs, EPROMs, EEPROMs, DRAMs, VRAMs, flash memory devices, magnetic or optical cards, nanosystems (including molecular memory ICs), or any type of media or device suitable for storing instructions and/or data. Stored on any one of the computer readable medium (media), the present invention includes software for controlling both the hardware of the general purpose/specialized computer or microprocessor, and for enabling the computer or microprocessor to interact with a human viewer or other mechanism utilizing the results of the present invention. Such software may include, but is not limited to, device drivers, operating systems, execution environments/containers, and applications.

The foregoing description of various embodiments of the claimed subject matter has been provided for the purposes of illustration and description. It is not intended to be exhaustive or to limit the claimed subject matter to the precise forms disclosed. Many modifications and variations will be apparent to the practitioner skilled in the art. Particularly, while the concept "component" is used in the embodiments of the systems and methods described above, it will be evident that such concept can be interchangeably used with equivalent concepts such as class, method, type, interface, module, object model, and other suitable concepts. Embodiments were chosen and described in order to best describe the principles of the invention and its practical application, thereby enabling others skilled in the relevant art to understand the claimed subject matter, the various embodiments and with various modifications that are suited to the particular use contemplated.

What is claimed is:

1. A system to support dynamic regression test suite generation using coverage-based clustering, comprising:
   a data collection and analysis engine running on a host, which in operation, is configured to
      collect coverage data for code coverage by a plurality of register-transfer level (RTL) modules in an integrated circuit (IC) design for testing of the IC design through simulations, wherein the IC design is a system-on-chip (SOC) design or an application-specific integrated circuit (ASIC) design, and wherein the coverage data provides a measure of how well functionalities of the IC design are covered;

generate a plurality of clusters of related RTL modules of the IC design based on statistical analysis of the collected coverage data and hierarchal information of the RTL modules; and a regression test generation engine running on a host, which in operation, is configured to identify a plurality of affected RTL modules based on the clusters of the RTL modules when changes are made to the RTL modules during the IC design;

generate a plurality of regression tests dynamically during the IC design for the plurality of affected RTL modules based on their corresponding coverage data and without reliance on user requirements documentation;

run the plurality of generated regression tests that is targeted and simulates the IC design and verifies the changes made in the IC design with a desired confidence level at a faster run time.

2. The system of claim 1, wherein:
metrics of the coverage data collected for code coverage include one or more of line coverage, condition coverage, branch coverage, path coverage, and toggle coverage.

3. The system of claim 2, wherein:
the data collection and analysis engine is configured to choose one of the metrics of the coverage data having the maximum amount of information of the IC design.

4. The system of claim 1, wherein:
the data collection and analysis engine is configured to store the coverage data collected in a coverage database on per RTL module and per test basis.

5. The system of claim 4, wherein:
the data collection and analysis engine is configured to utilize a standardized interface to extract the coverage data from the coverage database as a data-frame, which is a table with labeled columns in a comma-separated format.

6. The system of claim 5, wherein:
the data collection and analysis engine is configured to validate the clusters of RTL modules by dividing the coverage data-frame into a plurality of smaller data-frames, one for each cluster.

7. The system of claim 1, wherein:
the data collection and analysis engine is configured to standardize the coverage data for different types of code-coverage to make them comparable and to generate a global score is a product of coverage-value of each of RTL modules with its depth in a hierarchy of the IC design.

8. The system of claim 1, wherein:
the data collection and analysis engine is configured to reduce the coverage data to a subset of reduced data frame without losing pertinent information for data analysis.

9. The system of claim 1, wherein:
the data collection and analysis engine is configured to determine which of the RTL modules in the IC design are correlated by identifying subgroups in the collected coverage data through unsupervised learning based upon similarity or dissimilarity between each pair of the RTL modules in terms of their coverage data.

10. The system of claim 9, wherein:
the data collection and analysis engine is configured to utilize a similarity matrix among the RTL modules for similarity analysis, wherein the similarity matrix is a table generated from the coverage data with rows labeled with module names and column labeled with test names to compare behavior of different modules for the tests.

11. The system of claim 10, wherein:
the data collection and analysis engine is configured to group the correlated RTL modules into the plurality of module clusters based upon the similarity matrix.

12. The system of claim 1, wherein:
the data collection and analysis engine is configured to generate the plurality of module clusters via k-means clustering, where an initial guess for the number of clusters k is automatically adjusted to fit the clusters to the IC design.

13. The system of claim 1, wherein:
the data collection and analysis engine is configured to perform repeated clustering of the RTL modules, where a first level of clustering yields the best clustering for only a relatively small number of clusters;
use the first level of clustering to divide the IC design into two or more distinct groups of RTL modules and run separate clustering processes for each of those groups.

14. The system of claim 1, wherein:
the regression test generation engine is configured to generate a list of files modified since last check-out of the IC design;
identify one or more modified RTL modules based on the list of the modified files;
identify the plurality of affected RTL modules in the same cluster as those modified RTL modules.

15. The system of claim 14, wherein:
the regression test generation engine is configured to grade and rank the plurality of regression tests according to one of the metrics of their corresponding coverage data depending upon specific requirements of the regression.

16. The system of claim 1, wherein:
the regression test generation engine is configured to utilize a plurality of resource constraints defined by a user as regression test selection criteria to select the plurality of regression tests.

17. A computer-implemented method to support dynamic regression test suite generation using coverage-based clustering, comprising:
collecting coverage data for code coverage by a plurality of register-transfer level (RTL) modules in an integrated circuit (IC) design for testing of the IC design through simulations, wherein the coverage data provides a measure of how well functionalities of the IC design are covered;
generating a plurality of clusters of related RTL modules of the IC design based on statistical analysis of the collected coverage data and hierarchal information of the RTL modules;
identifying a plurality of affected RTL modules based on the clusters of the RTL modules when changes are made to the RTL modules in the IC design;
generating a plurality of regression tests dynamically for these affected RTL modules based on their corresponding coverage data;
reducing the coverage data to a subset of reduced data frame without losing pertinent information for data analysis; and running the generated regression tests that is targeted and simulates the IC design and verifies the changes made in the IC design with a desired confidence level at a faster run time.

18. The computer-implemented method of claim 17, further comprising:
choosing one of metrics of the coverage data collected having the maximum amount of information of the IC design.

19. The computer-implemented method of claim 17, further comprising:
storing the coverage data collected in a coverage database on per RTL module and per test basis.

20. The computer-implemented method of claim 19, further comprising:
utilizing a standardized interface to extract the coverage data from the coverage database as a data-frame, which is a table with labeled columns in a comma-separated format.

21. The computer-implemented method of claim 20, further comprising:
validating the clusters of RTL modules by dividing the coverage data-frame into a plurality of smaller data-frames, one for each cluster.

22. The computer-implemented method of claim 17, further comprising:
standardizing the coverage data for different types of code-coverage to make them comparable and to generate a global score is a product of coverage-value of each of RTL modules with its depth in a hierarchy of the IC design.

23. The computer-implemented method of claim 17, further comprising:
determining which of the RTL modules in the IC design are correlated by identifying subgroups in the collected coverage data through unsupervised learning based upon similarity or dissimilarity between each pair of the RTL modules in terms of their coverage data.

24. The computer-implemented method of claim 23, further comprising:
utilizing a similarity matrix among the RTL modules for similarity analysis, wherein the similarity matrix is a table generated from the coverage data with rows labeled with module names and column labeled with test names to compare behavior of different modules for the tests.

25. The computer-implemented method of claim 24, further comprising:
grouping the correlated RTL modules into the plurality of module clusters based upon the similarity matrix.

26. The computer-implemented method of claim 17, further comprising:
generating the plurality of module clusters via k-means clustering, where an initial guess for the number of clusters k is automatically adjusted to fit the clusters to the IC design.

27. The computer-implemented method of claim 17, further comprising:
performing repeated clustering of the RTL modules, where a first level of clustering yields the best clustering for only a relatively small number of clusters; and
using the first level of clustering to divide the IC design into two or more distinct groups of RTL modules and run separate clustering processes for each of those groups.

28. The computer-implemented method of claim 17, further comprising:
generating a list of files modified since last check-out of the IC design;
identifying one or more modified RTL modules based on the list of the modified files; and
identifying the plurality of affected RTL modules in the same cluster as those modified RTL modules.

29. The computer-implemented method of claim 28, further comprising:
grading and ranking the plurality of regression tests according to one of the metrics of their corresponding coverage data depending upon specific requirements of the regression.

30. The computer-implemented method of claim 28, further comprising:
utilizing a plurality of resource constraints defined by a user as regression test selection criteria to select the plurality of regression tests.

31. A non-transitory storage medium having software instructions stored thereon that when executed cause a system to:
collect coverage data for code coverage by a plurality of register-transfer level (RTL) modules in an integrated circuit (IC) design for testing of the IC design through simulations, wherein the coverage data provides a measure of how well functionalities of the IC design are covered;
generate a plurality of clusters of related RTL modules of the IC design based on statistical analysis of the collected coverage data and hierarchal information of the RTL modules;
identify a plurality of affected RTL modules based on the clusters of the RTL modules when changes are made to the RTL modules in the IC design;
generate a plurality of regression tests dynamically for these affected RTL modules based on their corresponding coverage data, wherein metrics of the coverage data collected for code coverage include one or more of line coverage, condition coverage, branch coverage, path coverage, and toggle coverage; and
run the generated regression tests that is targeted and simulates the IC design and verifies the changes made in the IC design with a desired confidence level at a faster run time.

* * * * *